United States Patent
Rankin et al.

(10) Patent No.: US 7,346,825 B2
(45) Date of Patent: Mar. 18, 2008

(54) ERROR METHOD, SYSTEM AND MEDIUM

(75) Inventors: Linda J. Rankin, Portland, OR (US); David J. O'Shea, Costa Mesa, CA (US)

(73) Assignee: Intel Corporation, Santa Clara, CA (US)

( * ) Notice: Subject to any disclaimer, the term of this patent is extended or adjusted under 35 U.S.C. 154(b) by 1274 days.

(21) Appl. No.: 09/948,299

(22) Filed: Sep. 6, 2001

(65) Prior Publication Data

US 2003/0046628 A1 Mar. 6, 2003

(51) Int. Cl.
 H03M 13/00 (2006.01)
 G06F 11/00 (2006.01)
 G01R 31/28 (2006.01)
 G01D 3/00 (2006.01)
 G01R 27/28 (2006.01)

(52) U.S. Cl. .................. 714/752; 714/712; 714/48; 702/108; 702/109; 702/118

(58) Field of Classification Search ............ 714/45, 714/57, 48, 752, 746, 10, 11
See application file for complete search history.

(56) References Cited

U.S. PATENT DOCUMENTS

| | | | | |
|---|---|---|---|---|
| 5,457,683 A | * | 10/1995 | Robins | 370/258 |
| 5,467,295 A | * | 11/1995 | Young et al. | 709/210 |
| 5,590,124 A | * | 12/1996 | Robins | 370/258 |
| 5,619,644 A | * | 4/1997 | Crockett et al. | 714/45 |
| 5,740,376 A | * | 4/1998 | Carson et al. | 710/35 |
| 6,138,249 A | * | 10/2000 | Nolet | 714/25 |
| 6,141,769 A | * | 10/2000 | Petivan et al. | 714/10 |
| 6,163,763 A | * | 12/2000 | Cox et al. | 703/17 |
| 6,240,526 B1 | * | 5/2001 | Petivan et al. | 714/11 |
| 6,438,660 B1 | * | 8/2002 | Reams | 711/143 |
| 6,536,000 B1 | * | 3/2003 | Jackson et al. | 714/57 |
| 6,647,516 B1 | * | 11/2003 | Rust et al. | 714/48 |
| 6,662,319 B1 | * | 12/2003 | Webb, Jr. et al. | 714/52 |
| 6,675,344 B1 | * | 1/2004 | Sharma | 714/763 |
| 6,802,039 B1 | * | 10/2004 | Quach et al. | 714/763 |
| 6,915,450 B2 | * | 7/2005 | Phelps et al. | 714/16 |
| 7,068,680 B1 | * | 6/2006 | Kaltenmark et al. | 370/469 |
| 7,080,309 B2 | * | 7/2006 | Sharma | 714/763 |

* cited by examiner

*Primary Examiner*—Phung M. Chung
(74) *Attorney, Agent, or Firm*—Caven & Aghevli LLC

(57) ABSTRACT

Error detection methods, systems and medium are provided. The error detection method may comprise processing error conditions associated with transactions in a manner that may enable error source identification. The system may comprise a plurality of nodes of components. The nodes may include storage elements to record an error condition indicative of whether a component provided an indication of detecting an error in response to processing the transaction.

27 Claims, 4 Drawing Sheets

ERROR METHOD, SYSTEM AND MEDIUM

BACKGROUND

Errors occasionally occur during operation of a computing device. Some computing devices may include hardware and/or encoding schemes which may enable correction of correctable errors such as, for example, a single-bit error on data having an error correction code (ECC). Some computing devices may also include firmware or system software which may enable recovery from some uncorrectable errors such as, for example, multi-bit ECC errors. Besides correctable errors and uncorrectable errors, computing devices may also encounter fatal errors which are uncorrectable and unrecoverable due to the nature of the error or the lack of suitable hardware, firmware, and/or software.

Information identifying the source of the error may enable computing devices and/or technicians servicing the computing devices to more effectively handle errors. However, the task of identifying the source of an error is exacerbated by the fact that computing devices often have multiple components, multiple interfaces, and/or multiple transfer paths which may be the source of the error.

BRIEF DESCRIPTION OF THE DRAWINGS

For simplicity and clarity of illustration, elements illustrated in the figures are not necessarily drawn to scale. For example, the dimensions of some of the elements may be exaggerated relative to other elements for clarity. Further, where considered appropriate, reference numerals have been repeated among the figures to indicate corresponding or analogous elements.

DETAILED DESCRIPTION

In the following detailed description, numerous specific details are described in order to provide a thorough understanding of the invention. However, it will be understood by those skilled in the art that the present invention may be practiced without these specific details. In other instances, well-known methods, procedures, components and circuits have not been described in detail so as not to obscure the present invention.

Some portions of the detailed description which follow are presented in terms of algorithms and symbolic representations of operations on data bits or binary digital signals within a memory. These algorithmic descriptions and representations may be the techniques used by those skilled in the data processing arts to convey the substance of their work to others skilled in the art.

An algorithm is here, and generally, considered to be a self-consistent sequence of acts or operations leading to a desired result. These include physical manipulations of physical quantities. Usually, though not necessarily, these quantities take the form of electrical, magnetic, and/or optical signals capable of being stored, transferred, combined, compared, and/or otherwise manipulated. It has proven convenient at times, principally for reasons of common usage, to refer to these signals as bits, values, elements, symbols, characters, terms, numbers or the like. It should be understood, however, that all of these and similar terms are to be associated with the appropriate physical quantities and are merely convenient labels applied to these quantities.

In the following description and claims, the terms "coupled" and "connected," along with their derivatives, may be used. It should be understood that these terms are not intended as synonyms for each other. Rather, in particular embodiments, "connected" may be used to indicate that two or more elements are in direct physical or electrical contact with each other. "Coupled" may mean that two or more elements are in direct physical or electrical contact. However, "coupled" may also mean that two or more elements are not in direct contact with each other, but yet still co-operate or interact with each other.

Figure 1:
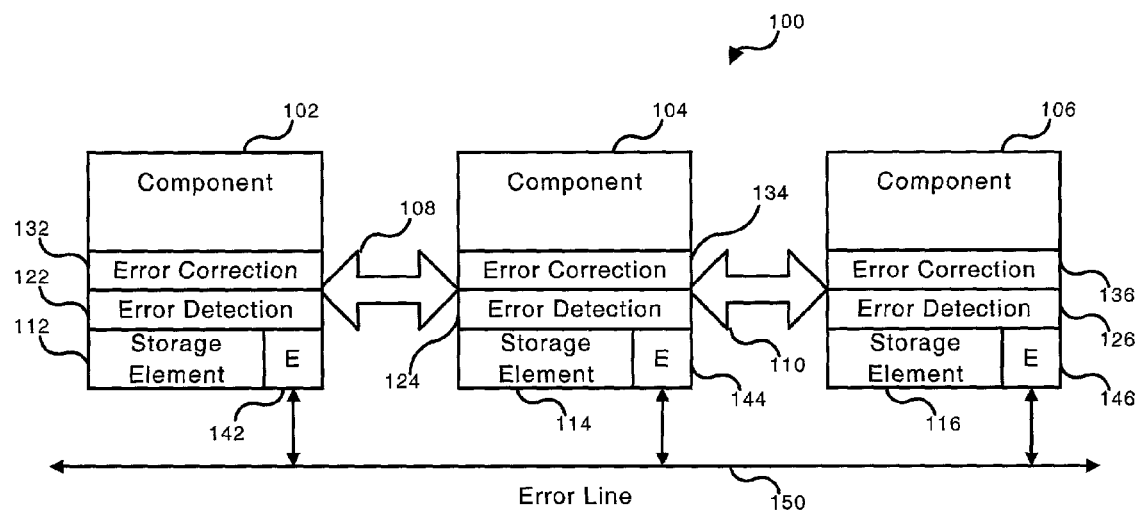
FIG. 1 is a simplified block diagram illustrating an example system utilizing one or more error lines.

Referring now to FIG. 1, an example system 100 may comprise components 102, 104, 106 such as, for example, processors, memory controllers, bus bridges, direct memory access controllers, video controllers and node switches that may be coupled to one another via buses 108, 110. Components 102, 104, 106 may communicate with one another via transactions such as, for example, read transactions, write transactions, special transactions upon one or more buses 108, 110. For example, component 102 may initiate a transaction upon bus 108 that targets component 104 and/or component 106. Component 104 may initiate a transaction upon bus 108 that targets component 102 and/or may initiate a transaction upon bus 110 that targets component 108. Component 106 may initiate a transaction upon bus 110 that targets component 102 and/or component 104.

Example system 100 further comprises storage elements 112, 114, 116 that are respectively associated with components 102, 104, 106. Storage elements 112, 114, 116 may comprise registers, latches, or other storage devices in the components 102, 104,106. However, the storage elements 112, 114, 116 may alternatively, or in addition, comprise one or more storage devices external to the components 102, 104, 106.

The components 102, 104, 106 may further comprise error detection circuits 122, 124, 126. The error detection circuits 122, 124, 126 may detect errors such as, for example, correctable errors, uncorrectable errors, and/or fatal errors that occur during or that are otherwise associated with a transaction. For example, the error detection circuits 122 of component 102 may detect an error based upon error coverage information such as, for example, parity bits, error correction codes (ECCs), checksums, cyclical redundancy check values and/or other signals received during a transaction. Besides detecting errors based upon error coverage information, error detection circuits 122, 124, 126 may further detect protocol errors, timeout errors, hardware failures, coherency errors, as well as other types of errors based upon signals received and/or not received during a transaction.

The components 102, 104, 106 may also comprise error correction circuits 132, 134, 136. The error correction circuits 132, 134, 136 may correct errors or subsets of errors detected by the error detection circuits 122, 124, 126. For example, error correction circuits 132, 134, 136 may correct single-bit data errors based upon error coverage information associated with the transaction.

The components 102, 104, 106 may further comprise error condition interfaces 142, 144, 146. Each error condition interface 142, 144, 146 may be coupled to one or more error lines 150 to enable each error condition interface 142, 144, 146 to receive error conditions from other components and to provide error conditions to other components. In an example embodiment, the error line 150 is pulled to a non-asserted or de-asserted state by a resistive element and a reference voltage not shown thus forming a wired-OR configuration. Each error condition interface 142, 144, 146 may pull the error line 150 to an asserted state to inform the other components that the component 102, 104, 106 associated with the error condition interface 142, 144, 146 detected an error with the transaction.

Figure 2:
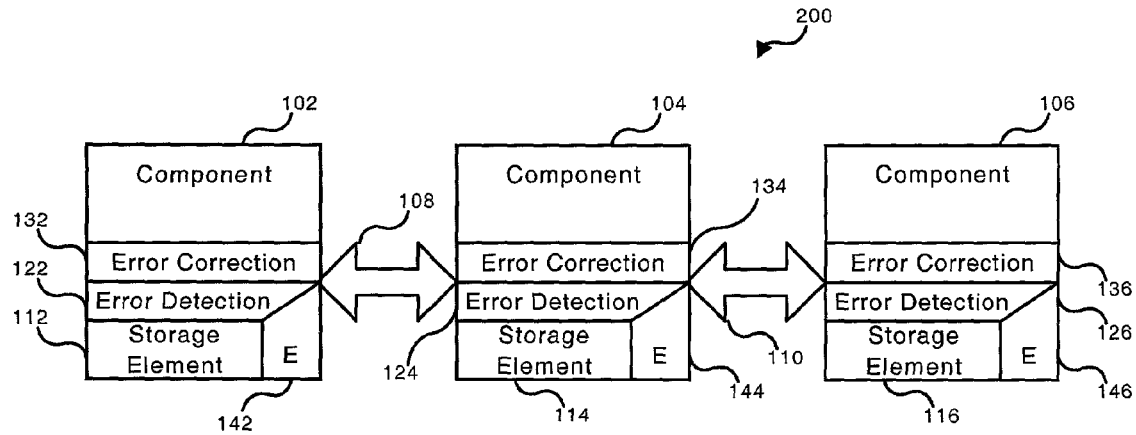
FIG. 2 is a simplified block diagram illustrating another example system utilizing in band communication of error conditions.

Another example system 200 is illustrated in FIG. 2. The example system 200 may also comprise components 102, 104, 106 and buses 108, 110. The components 102, 104, 106 may comprise error detection circuits 122, 124, 126, error correction circuits 132, 134, 136, and error condition interfaces 142, 144, 146. However, the example system 200 unlike the example system 100 of FIG. 1 does not utilize a separate error line. Instead, the error condition interfaces 142, 144, 146 may provide and receive error conditions in band with the transaction via buses 108, 110. The transaction may include phases, cycles, headers, payloads, and/or some other mechanism in which the error condition interfaces 142, 144, 146 may provide and/or may receive error conditions.

Figure 3:
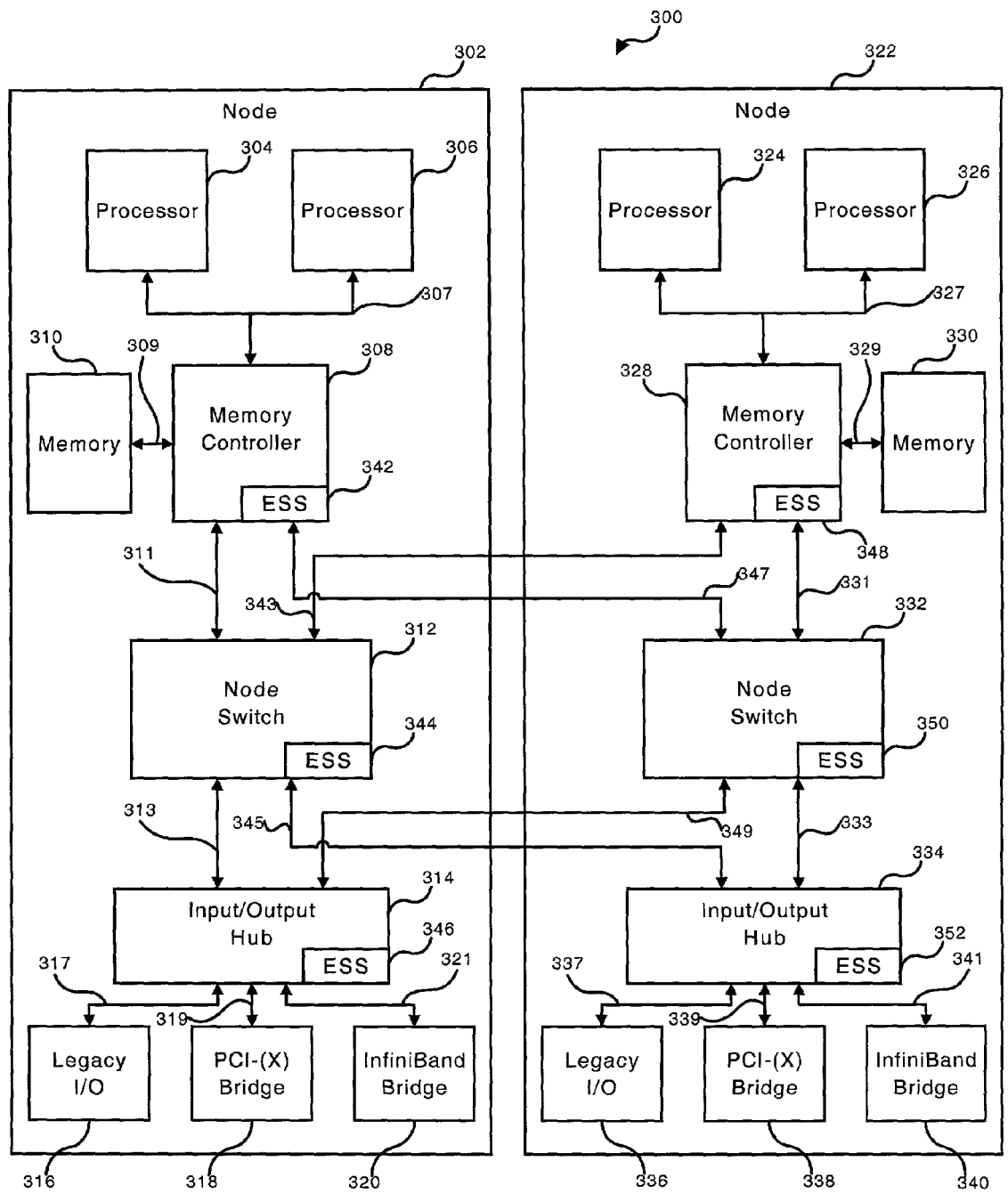
FIG. 3 is a simplified block diagram illustrating yet another example system utilizing one or more error lines and/or in band communication of error conditions.

Yet another example system 300 is illustrated in FIG. 3. The example system 300 generally depicts a multi-node, multi-processor computing device. As depicted, the example system 300 may comprise a first node 302 comprising processors 304, 306, memory controller 308 coupled to the processors 304, 306 via a processor bus 307, memory 310 coupled to the memory controller 308 via a memory bus 309, node switch 312 coupled to the memory controller 308 via a bus 311, I/O hub 314 coupled to the node switch 312 via a bus 313, and I/O bridges 316, 318, 320 coupled to the I/O hub 314 via buses 317, 319, 321. The example system may further comprise a second node 322 comprising processors 324, 326, memory controller 328 coupled to the processors 324, 326 via a processor bus 327, memory 330 coupled to the memory controller 328 via a memory bus 329, node switch 332 coupled to the memory controller 328 via a bus 331, I/O hub 334 coupled to the node switch 332 via a bus 333, and I/O bridges 336, 338, 340 coupled to the node switch 332 via buses 337, 339, 341. Moreover, the node switch 312 of the first node 302 may be further coupled to the memory controller 328 of the second node 322 via a bus 343 and to the I/O hub 334 of the second node 322 via a bus 345. Further, the node switch 332 of the second node 322 may be further coupled to the memory controller 308 of the first node 302 via a bus 347 and to the I/O hub 314 of the first node 302 via a bus 349.

The memory controllers 308, 328, node switches 312, 332, and I/O hubs 314, 334 may comprise storage elements, error detection circuits, error correction circuits, and/or error condition interfaces shown generally as error source support (ESS) circuits 342, 344, 346, 348, 350, 352. ESS circuits 342, 344, 346, 348, 350, 352 may be coupled to one another via one or more error lines (not shown) in a manner similar to system 100 of FIG. 1. Alternatively, or in addition, ESS circuits 342, 344, 346, 348, 350, 352 may receive and provide error conditions in band with transactions in a manner similar to system 200 of FIG. 2. Moreover, while components 308, 312, 314, 328, 332, 334 are illustrated for simplicity with internal ESS circuits 342, 344, 346, 348, 350, 352, all or portions of the ESS circuits 342, 344, 346, 348, 350, 352 may be implemented external to the respective components 308, 312, 314, 328, 332, 334. For example, the storage elements of the ESS circuits 342, 344, 346, 348, 350, 352 may be implemented in one or more of memory 310, 330.

Figure 4:
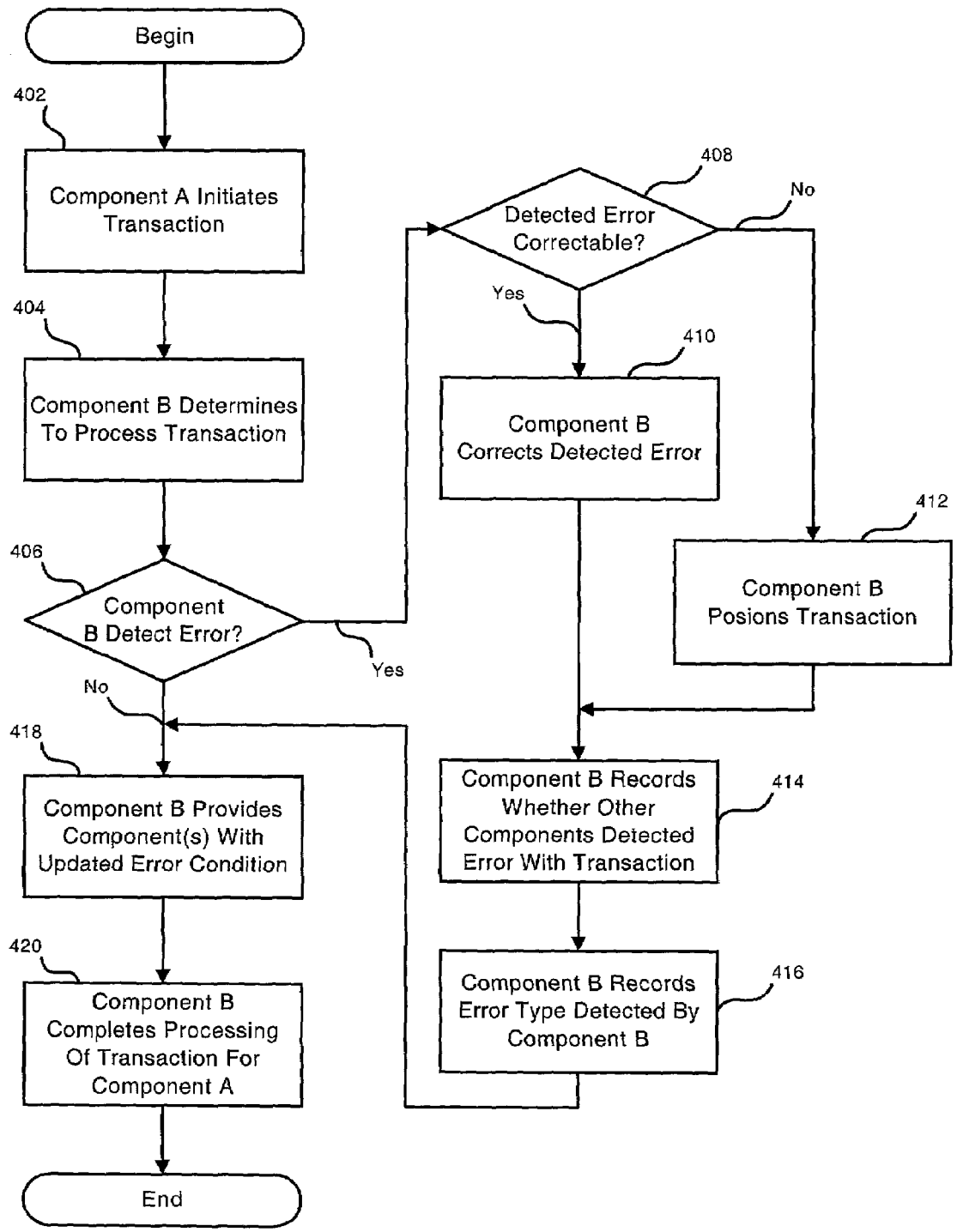
FIG. 4 is a flowchart illustrating an example transaction processing method that may be used by example systems of FIGS. 1-3.

In FIG. 4, there is depicted an example transaction processing method 400 that may be used by systems 100, 200, 300. While FIG. 4 is described primarily in regard to example systems 100, 200, the example method 400 is also applicable to the operation of the components of system 300 and in particular to the memory controllers 308, 328, node switches 312, 332, and I/O hubs 314, 334.

In block 402, the component 102 may initiate a transaction such as, for example, a read transaction, write transaction, read invalidate transaction, and/or a special transaction upon the bus 108. In block 404, the component 104 coupled to the bus 108 may determine to process the transaction initiated in block 402 based upon information transferred on the bus 108 such as, for example, address and/or control signals.

The component 104 may attempt to complete the transaction initiated in block 402. For example, the component 104 may provide the component 102 with data requested by the component 102, may cause data provided by the component 102 to be stored, may cause data to be updated in a manner indicated by the component 102, and/or may cause the transaction to be deferred or retried to free the initiating component 102 and the bus 108.

To complete the transaction, the component 104 may reinitiate the transaction upon the bus 110 to request data and/or other information from the component 106, and/or to provide data and/or other information to the component 106 thus providing an opportunity for the other component 106 to introduce or detect an error associated with the transaction. The component 106 may in turn reinitiate the transaction upon another bus (not shown) to request data and/or other information from other components (not shown). Accordingly, several components may be involved in a transaction and each of these several components may encounter or detect an error in response to processing the transaction.

The component 104 in block 406 determines whether an error has occurred in response to processing the transaction. As mentioned above, the component 104 may reinitiate the transaction on the bus 110 bus in order to receive information from and/or send information to the component 106. Due to reinitiating the transaction, the error detection circuit 124 of the component 106 may detect various errors associated with the transaction such as, for example, data parity errors, address parity errors, ECC errors, checksum errors, cyclical redundancy check errors, framing errors, protocol errors, timeout errors, hardware failure errors, as well as several other types of errors.

If the component 104 determines that an error has occurred in response to processing the transaction, then the error correction circuit 134 may further determine whether the error detected by the error detection circuit 124 is correctable (block 408). If the error is correctable, the error correction circuit 134 may signal another component such as, for example, a processor or an interrupt controller that a correctable error was detected and correct the error (block 410). For example, the error correction circuit 134 may determine (block 408) that the detected error is a correctable single-bit data error, and correct (block 410) the single-bit data error based upon an ECC or other error coverage information of the transaction.

If the error is uncorrectable, the error correction circuit 134 may poison (block 412) the transaction to ensure that other components detect that the transaction encountered an error. For example, the error correction circuit 134 may determine (block 408) that the detected error is an uncorrectable multi-bit data error, determine new error coverage information (e.g. a parity bit) for the received data of the transaction, and poison (block 412) the transaction by altering the error coverage information (e.g. inverting the parity bit) to ensure that other components detect that the transaction encountered an error. It should be appreciated that the transaction may be poisoned via various techniques such as, for example, providing the transaction with error codes, providing other components with error signals, altering parity bits, error correction codes, cyclical redundancy check values, checksum values, and/or other error coverage information, etc.

The component 104 in block 414 may store, record, and/or otherwise update information of the storage element 114 to indicate whether another component has detected an error in response to processing the transaction. In an example embodiment, the error condition interface 144 of the component 104 is provided with an error condition that is indicative of whether another component has detected an error in response to processing the transaction. The component 104 may therefore record information based upon the received error condition that is indicative of whether at least one other component detected an error in response to processing the transaction. Accordingly, if no other component detected an error, then the component 104 may store, record, and/or otherwise update information in the storage element 114 associated with the component 104 to indicate that no error was detected by the other components. Conversely, if at least one other component detected an error, then the component 104 may store, record, or otherwise update information in the storage element 114 to indicate that at least one other component detected an error.

The component 104 may further store, record, and/or otherwise update information in the storage element 114 to be further indicative of a type of error detected by the error detection circuit 124 (block 416). For example, the component 104 may store, record, and/or otherwise update information in the storage element 114 to indicate that a data parity error, an address parity error, an ECC error, a checksum error, a cyclical redundancy check error, a framing error, a protocol error, a timeout error, a hardware failure, and/or other error type was detected.

The component 104 may provide (block 418) one or more of the other components with an updated error condition. For example, if the component 104 detected (block 406) an error in response to processing the transaction, then the component 104 in block 418 may further provide an updated error condition that indicates that at least one component has detected an error in response to processing the transaction. In the example system of FIG. 1, the component 104 may assert a signal on the error line 150 that is coupled to the component 102 in order to provide the updated error condition. In the example system 200 of FIG. 2, the component 104 may provide the updated error condition in band with the transaction. For example, the component 104 may provide the updated error condition to component 102 via a response phase, an error phase, a payload, a header, control signals, and/or some other portion of the information exchange on the bus 108 during the transaction.

In block 420, the component 104 completes processing of the transaction. For example, the component 104 may provide the originating component 102 with data, response messages, error conditions, error types, and/or other information associated with the transaction.

It should be appreciated that while method 400 illustrates operation of the systems 100, 200, 300 as a sequence of operations, the systems 100, 200, 300 may perform the various operations in parallel or in a different order. Moreover, while method 400 was primarily described from the standpoint of component 102 originating a transaction and component 104 processing the transaction, other components of systems 100, 200, 300 may originate and process transactions in a similar manner.

Figure 5:
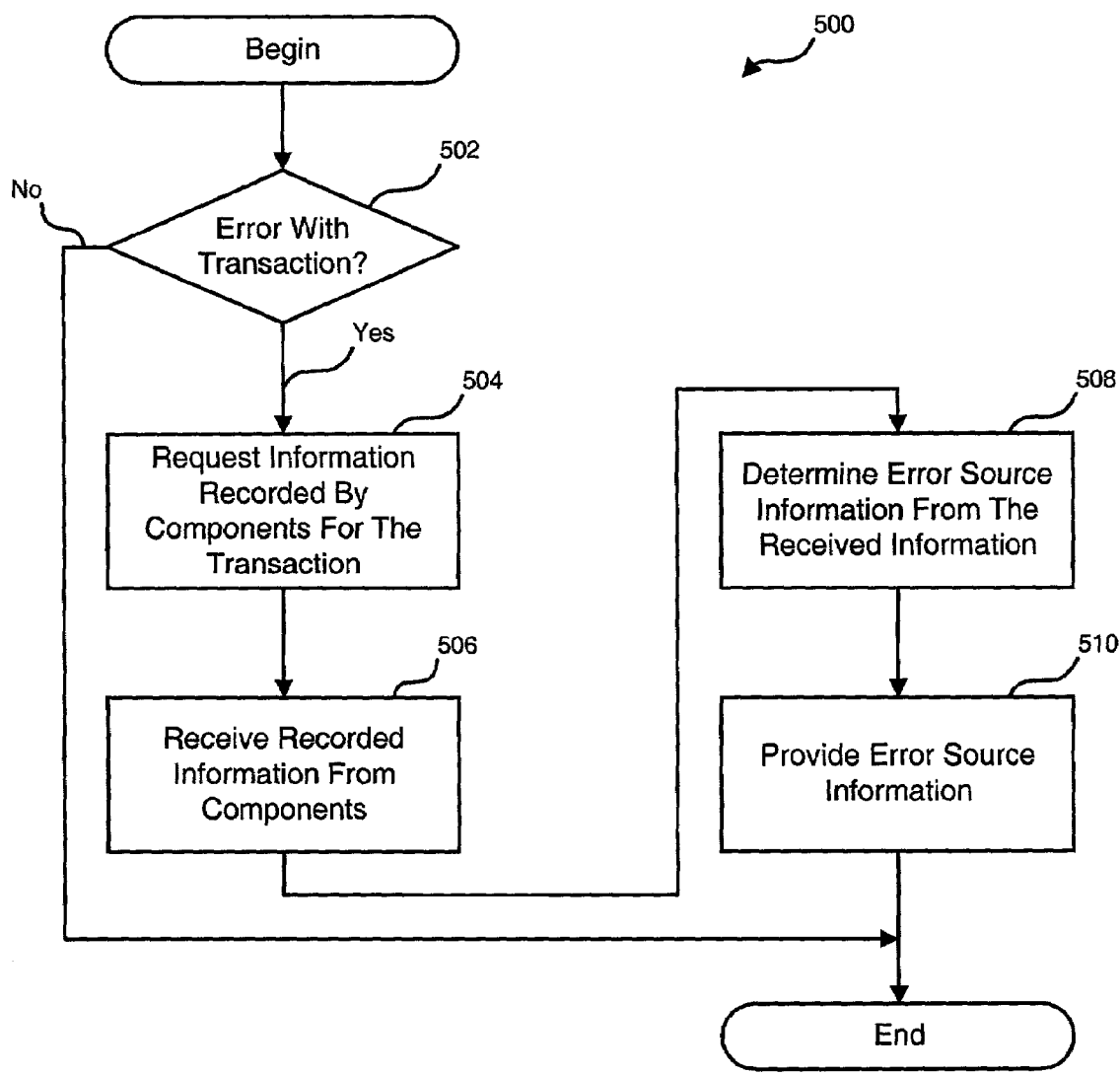
FIG. 5 is a flowchart illustrating an example method that may be used by example systems of FIGS. 1-3 to identify an error source of a transaction.

Referring now to FIG. 5, there is depicted a method 500 that may be used by systems 100, 200, 300 to identify an error source. The method 500 will be described primarily from the standpoint of system 300 executing instructions of a machine readable medium comprising one or more read only memory (ROM); random access memory (RAM); magnetic disk storage media; optical storage media; flash memory devices; and/or electrical, optical, acoustical or other form of propagated signals such as, for example, carrier waves, infrared signals, digital signals, analog signals. However, it should be appreciated that the description is also applicable to systems 100, 200, and it should also be appreciated that system 300 may alternatively implement all or a portion of the method 500 solely in hardware without executing instructions of a machine readable medium for such portions. Furthermore, while method 500 illustrates operation of the systems 100, 200, 300 as a sequence of operations, the systems 100, 200, 300 may perform the various operations in parallel or in a different order.

The processor 304 determines whether an error occurred with a transaction originated by the processor 304 or another component of the system 300 (block 502). For example, the processor 304 may determine that an error occurred with the transaction based upon error condition information provided by the other components of the transaction, error coverage information of the transaction, response signals, error signals, interrupt signals, and/or other signals associated with the transaction.

If the processor 304 determines that the transaction completed without an error, then the processor 304 may terminate the method 500 for the transaction. Otherwise, the processor 304 in block 504 may request information recorded by one or more of the storage elements associated with the components 308, 312, 314, 328, 332, 334. For example, the processor 304 may initiate one or more transactions to cause information to be transferred from one or more of the storage elements associated with components 308, 312, 314, 328, 332, 334 to the processor 304.

The processor 304 may receive (block 506) all or a portion of the information requested in block 504. The processor 304 in block 508 may analyze the information received in block 506 to determine and/or identify the source and/or type of the detected error. The processor 304 in block 510 may provide error source information indicative of the source and/or type of the error. For example, the processor 304 may analyze (block 508) the error source information to obtain an error source identifier and/or an error type identifier. The processor 304 may then provide (block 510) the error source information by storing the error source identifier and/or error type identifier in one or more log files, storing the error source identifier and/or error type identifier in one or more registers of the processor 304, and/or presenting the error source identifier and/or error type identifier via a display, printer, or other output device (not shown). Alternatively, the processor 304 may skip the analysis of block 508 and simply store and or present all or a portion of the information received in block 506.

The method 500 has been described primarily from the standpoint of processor 302 identifying an error source. However, it should be appreciated that the operations of method 500 may be implemented by other components of systems 100, 200, 300. Furthermore, the operations of method 500 may be distributed among multiple components of systems 100, 200, 300.

To provide a better understanding of methods 400, 500, a specific example follows. The processor 306 of the first node 302 may initiate (block 402) a memory read transaction on processor bus 307 that targets an address of the memory 330 of second node 322. As a result of initiating the transaction, the memory controller 308 of the first node 302 may determine (block 404) to process the transaction and initiate the transaction on the bus 311, which in turn may cause the node switch 312 of the first node 302 to determine (block 404) to process the transaction and initiate the transaction on the bus 343, which in turn may cause the memory controller 328 to determine (block 404) to process the transaction and initiate the transaction on the memory bus 329.

The memory controller 328 may receive the data requested by the processor 306 as well as an ECC for the data from the memory 330. The memory controller 328 may detect (block 406) a multi-bit data error based upon the ECC for the data. The memory controller 328 may determine (block 408) that the error is uncorrectable, and may poison (block 412) the ECC of the transaction. The memory controller 328 may record (block 414) an error condition that indicates the memory controller 328 has not received an indication that at least one other component of the system 300 detected an error with the transaction. The memory controller 328 may further record (block 416) an error type that indicates the transaction encountered a uncorrectable ECC memory read error. The memory controller 328 may also provide (block 418) the node switch 312 with an updated error condition for the transaction that indicates that at least one component detected an error with the transaction, and provide (block 420) the node switch 312 with the poisoned, uncorrected data. As indicated above, the memory controller 328 may provide the node switch 312 with the updated error condition in band with the uncorrected data and/or out of band via one or more error lines (not shown in FIG. 3) that indicates that an error has been detected.

The node switch 312 may detect (block 406) an ECC error based upon the poisoned ECC received from the memory controller 328. The node switch 312 may record (block 414) an error condition and may record (block 416) an error type indicative of an ECC switch error. Since the memory controller 328 provided an updated error condition to indicate that an error has been detected, the node switch 312 may record (block 414) an error condition that indicates that at least one other component provided an indication of an error with the transaction. The node switch 312 may provide (block 418) the memory controller 308 of the first node 302 with an updated error condition for the transaction that indicates that at least one component detected an error with the transaction. The node switch 312 may also provide (block 420) the memory controller 308 with the uncorrected data and a poisoned ECC.

The memory controller 308 may detect (block 406) an ECC error based upon the poisoned ECC received from the node switch 312. The memory controller 308 may record (block 414) an error condition and may record (block 416) an error type indicative of an ECC switch error. Since the memory controller 328 and/or the node switch 312 has provided an updated error condition to indicate that an error has been detected, the memory controller 308 may record (block 414) an error condition that indicates that at least one other component of the system 300 has provided an indication of an error with the transaction. The memory controller 308 may provide (block 418) the processor 304 with an updated error condition for the transaction that indicates that at least one component detected an error with the transaction. The memory controller 308 may also provide (block 420) the processor 304 with the data received from the node switch 312.

The processor 304 may detect (block 502) an error based upon the updated error condition provided by the memory controller 308 via an error response phase of processor bus 307 and/or some other signals. The processor 304 may initiate (block 504) one or more transactions upon the processor bus 307 to obtain error information recorded by the components 308, 312, 322 and may receive (block 506) the error information recorded by the components 308, 312, 322. Since the memory controller 308 and the node switch 312 of the first node 302 recorded that other components detected an error and the memory controller 328 of the second node 322 recorded that other components did not detect an error, the processor 304 may determine (block 508) that the memory controller 328 was the first component to detect the error with the transaction. Moreover, the processor 304 may determine (block 508) based upon the error type recorded by the memory controller 328 that a memory read transaction initiated by the memory controller 328 on the memory bus 329 resulted in the error. Accordingly, the processor 304 may determine (block 508) that the memory controller 328, the memory bus 329, and/or the memory 330 as the source and/or cause of the detected error. The processor 304 may provide the error source information in block 510 by logging the information and/or presenting the information via an output device. The processor 304 may further determine to take corrective measures to address the problem such as, for example, performing a memory diagnostic and/or disabling all or a portion of the memory 330.

While certain features of the invention have been illustrated and described herein, many modifications, substitutions, changes, and equivalents will now occur to those skilled in the art. It is, therefore, to be understood that the appended claims are intended to cover all such modifications and changes as fall within the true spirit of the invention.

What is claimed is:

1. A system comprising
   a first node of components comprising a processor, a memory controller, memory, and a node switch, the memory controller and the node switch each comprising a storage element to record an error condition indicative of whether at least one component provided an indication of detecting an error in response to processing a transaction;
   a second node of components comprising a processor, a memory controller, memory, and a node switch coupled to the first node, the memory controller and the node switch each comprising a storage element to record an error condition indicative of whether at least one component provided an indication of detecting an error in response to processing a transaction; and an error condition interface to provide at least one of the first node or the second node with an updated error condition that indicates detection of an error.

2. The system of claim 1, wherein the memory controllers and the node switches record the error condition in response to detecting an error with a transaction.

3. The system of claim 1, wherein the memory controllers and the nodes switches record the error condition and an error type in their respective storage elements in response to detecting an error with a transaction.

4. A system comprising
a first component to provide an error condition indicative of whether the first component detected an error associated with a transaction;
a second component to record the error condition if the second component in response to processing the transaction detects an error; and
an error condition interface to provide at least one of the first component or the second component with an updated error condition that indicates detection of an error.

5. The system of claim 4, wherein
the transaction provides error coverage information, and
the first component detects an error associated with the transaction based upon the error coverage information.

6. The system of claim 4, wherein
the transaction provides error coverage information, and
the first component corrects at least a subset of errors based upon the error coverage information.

7. The system of claim 4, wherein
the first component in response to detecting an error associated with the transaction poisons the transaction to ensure that the second component detects an error in response to processing the transaction.

8. The system of claim 4, further comprising a third component, wherein
the second component provides the third component with an updated error condition that is indicative of whether the second component detected an error in response to processing the transaction.

9. The system of claim 4, wherein
the first component comprises a first error condition interface, and
the second component comprises a second error condition interface coupled to the first error condition interface to receive the error condition.

10. A method comprising initiating a transaction,
receiving a plurality of error conditions for the transaction from a plurality of components, each error condition of a component indicative of whether at least one other component detected an error in response to processing the transaction; and
providing a first component of the plurality of components with an updated error condition that is indicative of a second component detecting an error with the transaction.

11. The method of claim 10, further comprising receiving the plurality of error conditions in response to an error with the transaction.

12. The method of claim 10, further comprising
providing, based upon the plurality of error conditions, an indication as to which component of the plurality of components first detected an error with the transaction.

13. A method of a component of a plurality of components, comprising
detecting an error associated with a transaction at the component;
updating information associated with the component to record an error condition that is indicative of whether another component of the plurality of components that processed the transaction prior to the component detected an error with the transaction, and
providing another component of the plurality of components with an updated error condition that is indicative of the component detecting the error with the transaction.

14. The method of claim 13, further comprising asserting an error signal to provide another component of the plurality of components with an updated error condition that is indicative of the component detecting an error with the transaction.

15. The method of clam 13, further comprising receiving the error condition in band with the transaction; and
providing an updated error condition in band with the transaction to another component of the plurality of components.

16. The method of claim 13, wherein
updating comprises recording in a register of the component the error condition and an error type for the error detected.

17. The method of claim 13, further comprising
receiving the error condition in band with the transaction; and
providing an updated error condition and an error type in band with the transaction to another component of the plurality of components.

18. A method of a component of a plurality of components, comprising
determining whether an error was detected in association with a transaction, receiving an error condition from at least one other component of the plurality of components that processed the transaction prior to the component;
recording the received error condition at the component in response to determining that an error was detected, and
providing to at least one other component of the plurality of components to process the transaction an updated error condition that is indicative of whether the component detected the error.

19. The method of claim 18, wherein recording comprises storing information that is indicative of the error condition and an error type.

20. The method of claim 18, further comprising
correcting an error associated with the transaction based upon error coverage information of the transaction.

21. The method of claim 18, further comprising
determining that an error is uncorrectable based upon error coverage information of the transaction; and
poisoning the transaction to ensure future detection of the error.

22. A component comprising
an error detection circuit to detect an error with a transaction processed by the component;
a storage element to record an error condition provided by at least one other component that processed the transaction prior to the component if the error detection circuit detects an error with the transaction; and
an error condition interface to provide at least one other component that processes the transaction after the component with an updated error condition that indicates that the component detected an error.

23. The component of claim 22, further comprising an error correction circuit to correct at least a subset of errors detected by the error detection circuit.

24. The component of claim 22, wherein the error condition interface is to receive the error condition provided by at least one other component.

25. The component of claim 22, wherein the storage element comprises a register to store the error condition and an error type associated with the detected error.

26. A machine readable medium comprising a plurality of instructions, that in response to being executed, result in a processor receiving a plurality of error conditions associated with a transaction, each error condition associated with a component of a plurality of components and indicative of whether at least one other component detected an error in response to processing the transaction, determining, based upon the plurality of error conditions, which component of the plurality of components first detected an error with the transaction; and providing a first component of the plurality of components with an updated error condition that is indicative of a second component detecting an error with the transaction.

27. The machine readable medium of claim 26, wherein the plurality of instructions further result in the processor receiving the plurality of error conditions in response to an error with the transaction being detected.

* * * * *

UNITED STATES PATENT AND TRADEMARK OFFICE
CERTIFICATE OF CORRECTION

PATENT NO. : 7,346,825 B2
APPLICATION NO. : 09/948299
DATED : March 18, 2008
INVENTOR(S) : Rankin et al.

It is certified that error appears in the above-identified patent and that said Letters Patent is hereby corrected as shown below:

In column 10, line 19, in Claim 15, delete "clam" and insert -- claim --, therefor.

Signed and Sealed this

Twenty-ninth Day of July, 2008

JON W. DUDAS
*Director of the United States Patent and Trademark Office*